United States Patent
Fukuhara et al.

(10) Patent No.: US 7,067,380 B2
(45) Date of Patent: Jun. 27, 2006

(54) SEMICONDUCTOR DEVICE AND MANUFACTURING METHOD THEREFOR

(75) Inventors: Jota Fukuhara, Yokkaichi (JP);
Hiroaki Tsunoda, Yokkaichi (JP);
Katsuyasu Shiba, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 58 days.

(21) Appl. No.: 10/635,676

(22) Filed: Aug. 7, 2003

(65) Prior Publication Data

US 2004/0180529 A1    Sep. 16, 2004

(30) Foreign Application Priority Data

Mar. 10, 2003 (JP) .............................. 2003-063733

(51) Int. Cl.
*H01L 21/336* (2006.01)
(52) U.S. Cl. ..................................................... 438/301
(58) Field of Classification Search ................ 438/301
See application file for complete search history.

(56) References Cited

U.S. PATENT DOCUMENTS

| | | | |
|---|---|---|---|
| 5,229,311 A | 7/1993 | Lai et al. | |
| 6,071,784 A | 6/2000 | Mehta et al. | |
| 6,190,966 B1 | 2/2001 | Ngo et al. | |

FOREIGN PATENT DOCUMENTS

| | | |
|---|---|---|
| CN | 1204867 A | 1/1999 |
| JP | 61-139066 | 6/1986 |
| JP | 4-215437 | 8/1992 |
| JP | 6-151736 | 5/1994 |
| JP | 11-17005 | 1/1999 |
| JP | 11-74472 | 3/1999 |
| JP | 2001-35844 | 2/2001 |

OTHER PUBLICATIONS

Stanley Wolf Silicon Processing for the VSLI Era vol. 2 Lattice Press 1990 pp. 273-275, 435.*
John L. Vossen Thin Film Processes II Acedemi Press1991 pp. 178,197,201.*
Charles Evans and associates (Analytical Services (Http://www.cea.com/tech.htm (pp. 1 and 9).*
Notification of Reasons for Rejection issued by the Japanese Patent Office, mailed Mar. 29, 2005 in counterpart Japanese Application No. 2003-063733, and English translation of Notification.
Notification of First Office Action issued by the Chinese Patent Office, mailed Oct. 14, 2005 in counterpart Chinese Application No. 2004100282521.

* cited by examiner

*Primary Examiner*—David S. Blum
(74) *Attorney, Agent, or Firm*—Finnegan, Henderson, Farabow, Garrett & Dunner, L.L.P.

(57) ABSTRACT

A semiconductor device manufacturing method includes forming a wiring layer, and forming a first insulating film on the wiring layer under a condition that hydrogen in a plasma is 1% or less in all gas components.

6 Claims, 3 Drawing Sheets

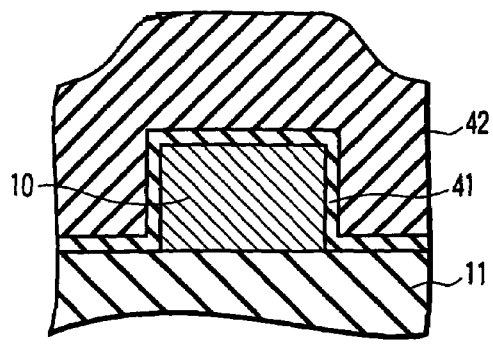
FIG. 9
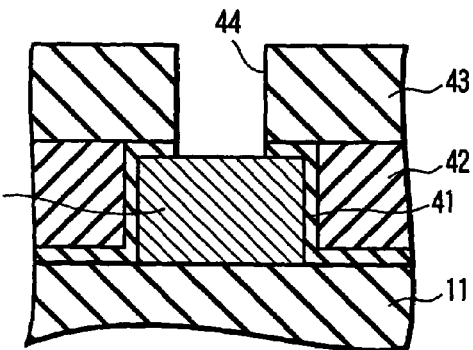
FIG. 12
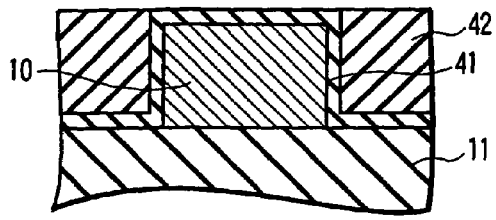
FIG. 10
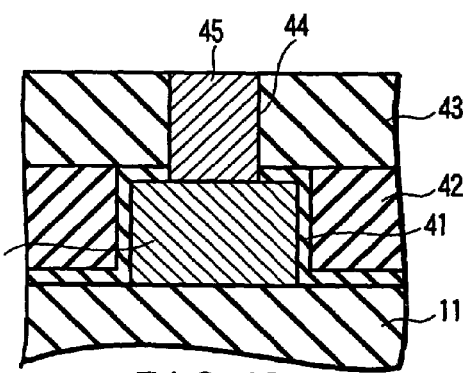
FIG. 13
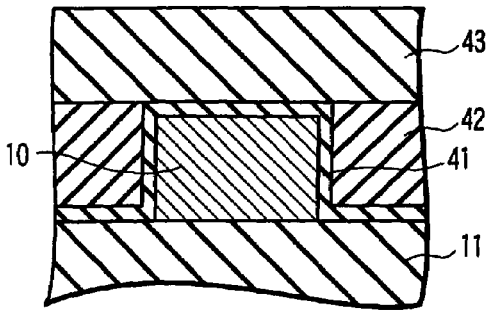
FIG. 11
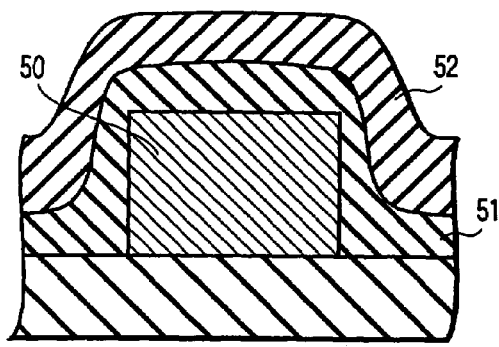
FIG. 14
FIG. 15
| Film structure | Shift amount ΔVth |
|---|---|
| With passivation film | 0.5V |
| Without passivation film | 0.3V |

SEMICONDUCTOR DEVICE AND MANUFACTURING METHOD THEREFOR

CROSS-REFERENCE TO RELATED APPLICATIONS

This application is based upon and claims the benefit of priority from the prior Japanese Patent Application No. 2003-063733, filed Mar. 10, 2003, the entire contents of which are incorporated herein by reference.

BACKGROUND OF THE INVENTION

1. Field of the Invention

The present invention relates to a nonvolatile semiconductor device and manufacturing method therefor.

2. Description of the Related Art

Nonvolatile memories such as NAND and NOR memories suffer the problem that a threshold Vth for operating a transistor varies in repetitive read/write of data. This problem becomes actualized along with reduction in the feature size of elements, and readily occurs when the film thickness of a gate insulating film is 80 Å or less.

To solve this problem, a multilayered structure using a passivation film has conventionally been adopted. In this multilayered structure, as shown in FIG. 14, a plasma-enhanced-SiON film 51 is formed on an upper metal wiring (e.g., Al-0.5 at % Cu) 50. A plasma-enhanced-SiN film 52 is formed on the SiON film 51. The SiN film 52 is used as a measure against moisture absorption, and the SiON film 51 is used to cut off hydrogen contained in the SiN film 52.

FIG. 15 shows data as a result of a comparison between a shift amount ΔVth in a structure having a passivation film and a shift amount ΔVth in a structure having no passivation film. The structure having a passivation film means a structure in which the SiN film 52 and SiON film 51 shown in FIG. 14 are stacked. As shown in FIG. 15, the structure having a passivation film exhibits a larger shift amount ΔVth than the structure having no passivation film.

The prior art cannot essentially suppress the shift ΔVth in an element which repeats data read/write even with a multilayered structure having a passivation film.

BRIEF SUMMARY OF THE INVENTION

A semiconductor device manufacturing method according to a first aspect of the present invention comprises forming a wiring layer, and forming a first insulating film on the wiring layer under a condition that hydrogen in a plasma is not more than 1% in all gas components.

A semiconductor device according to a second aspect of the present invention comprises a wiring layer, and a first insulating film which is formed on the wiring layer under a condition that hydrogen in a plasma is not more than 1% in all gas components.

BRIEF DESCRIPTION OF THE SEVERAL VIEWS OF THE DRAWING

FIGS. 9, 10, 11, 12, and 13 are sectional views, respectively, showing the steps in manufacturing a semiconductor device according to the fifth embodiment of the present invention;

FIG. 14 is a sectional view showing a semiconductor device having a conventional passivation film; and FIG. 15 is a table showing the shift amount ΔVth in the presence/absence of a conventional passivation film.

DETAILED DESCRIPTION OF THE INVENTION

Figure 1:
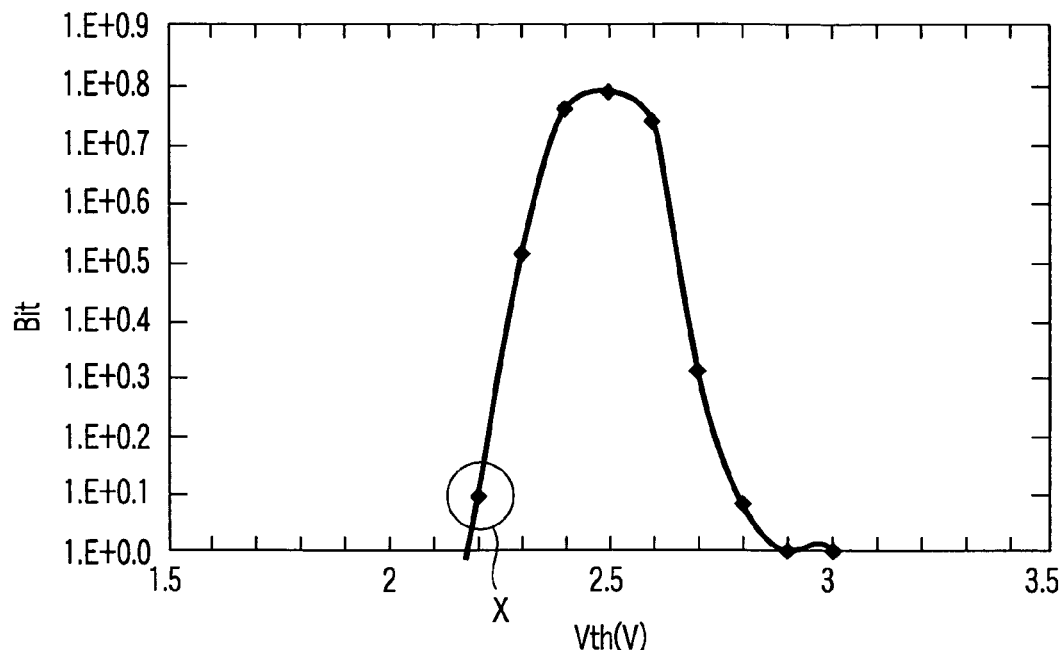
FIG. 1 is a graph showing "01 waveform" according to the first embodiment of the present invention.

Preferred embodiments of the present invention will be described below with reference to the several views of the accompanying drawing. In the following description, the same reference numerals denote the same parts throughout the views of the accompanying drawing.

FIRST EMBODIMENT

As described above, the prior art cannot essentially suppress the shift ΔVth of the threshold in an element which repeats data read/write even with a multilayered structure having a passivation film.

The primary cause was examined to find out that the hydrogen plasma causes the shift ΔVth. This will be explained in detail with reference to FIGS. 1 to 3.

To find the cause of the shift ΔVth, "01 waveform" is exemplified out of four signal waveforms (00 waveform, 01 waveform, 10 waveform, and 11 waveform) in a flash memory. Variations in arbitrary threshold X (see FIG. 1) at the trailing portion of "01 waveform" are experimented under various conditions. The transistor X is selected in "01 waveform" because a threshold at the trailing portion of "01 waveform" varies most.

This experiment uses a NAND element. The element is exposed to an atmosphere in which a plasma is generated in hydrogen-containing gas, and degradation in data retention characteristic is checked. At this time, $N_2/H_2$ is supplied and an RF plasma is generated in a chamber having parallel-plate counter electrodes. A plasma can be formed at $H_2/N_2=400/100$ sccm, a pressure of about 1 to 1.5 Torr, and an RF power of 750 W.

Figure 2:
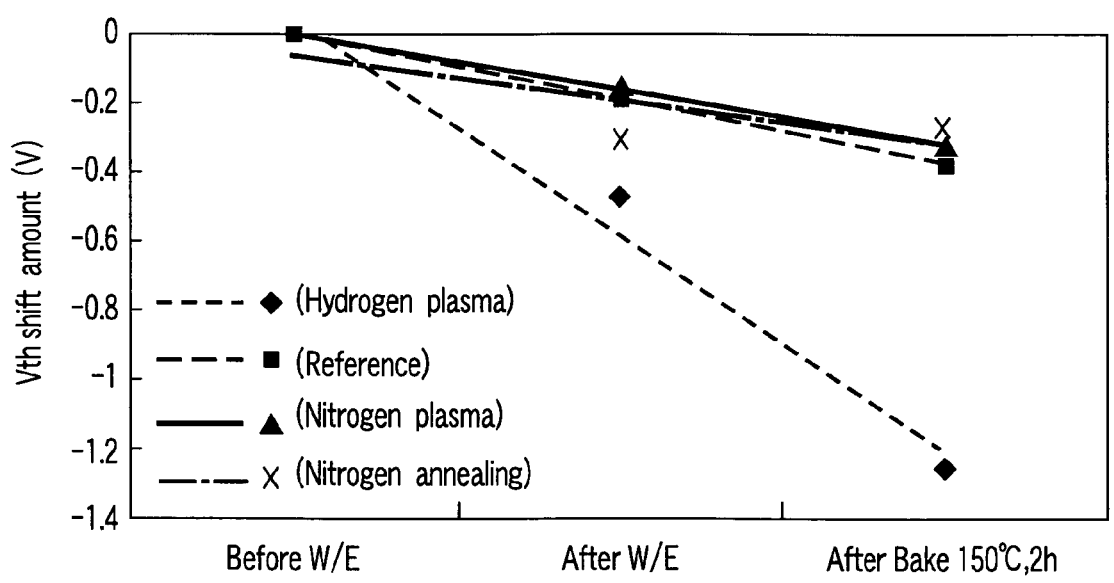
FIG. 2 is a graph showing the threshold shift amount according to the first embodiment of the present invention.

FIG. 2 shows the results of the experiment. On the abscissa of FIG. 2, "Before W/E" means "before data write/erase", "After W/E" means "after data write/erase", and "After Bake 150° C., 2 h" means "after baking at 150° C. for 2 h". Note that "−" on the ordinate of FIG. 2 means that the threshold X in FIG. 1 shifts left.

As shown in FIG. 2, when the element is exposed to the hydrogen plasma as a result of using a hydrogen plasma, reference, a nitrogen plasma, and nitrogen annealing, the shift amount ΔVth of the element greatly increases after baking.

Figure 3:
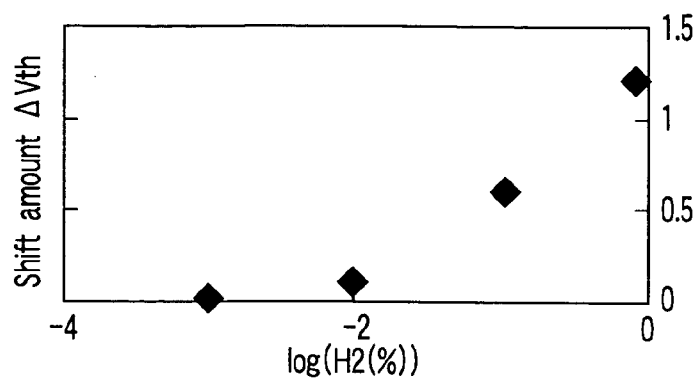
FIG. 3 is a graph showing the dependence of ΔVth on the $H_2$ concentration according to the first embodiment of the present invention.

FIG. 3 is a graph showing the relationship between the shift amount ΔVth in FIG. 2 and the ratio of $H_2/N_2$. As shown in FIG. 3, the shift amount ΔVth increases for a $\log(H_2 (\%))$ of −2 or more. "$\log(H_2 (\%))=-2$" means that $H_2$ in the plasma is 1% in all components. That is, exposure of the element to the $H_2$ plasma generates the shift ΔVth. At this time, $H_2$ in the plasma is 1% or more in all components.

From this, the shift ΔVth can be suppressed as long as $H_2$ or $SiH_4$ is 1% or less in all components in a gas plasma containing H such as $H_2$, $SiH_4$ ($SiH_4$ is decomposed into, e.g., $H_2$ and $SiH_2$) in formation of an insulating film, or $NH_3$. Hence, the above-described degradation in the data retention characteristic of the element can be prevented by forming a plasma insulating film such as an SiON film at a flow rate ratio at which $H_2$ or $SiH_4$ is 1% or less with respect to the total gas flow rate. This trend becomes conspicuous when the film thickness of the gate insulating film of the element is 80 Å or less.

An insulating film formed under a condition that hydrogen in the plasma is 1% or less in all gas components was examined by SIMS analysis to reveal that the film did not contain any hydrogen. This can also be investigated by HFS (Hydrogen Forward Scattering) analysis as long as the analysis area is about 1 cm$^2$ at a film thickness of about 1,000 Å to 2,000 Å.

According to the first embodiment, an element is formed in a step such as LP-CVD (Low Pressure-Chemical Vapor Deposition) or SOG (Spin On Glass) in which the element is not exposed to a hydrogen-containing plasma. This can suppress variations in threshold Vth for operating a transistor in repetitive data read/write of a nonvolatile memory such as a NAND or NOR memory. The element formed by applying the first embodiment can improve the Vth shift amount caused by repetitive data read/write by about 10 times the conventional shift amount.

The first embodiment is considered to be effective for all nonvolatile memories. That is, the first embodiment can be effectively applied to an element considered to degrade its characteristic upon exposure of the element to hydrogen, such as a ferroelectric memory (FeRAM) having a ferroelectric oxide or a magnetic random access memory (MRAM) having a high-k dielectric tunneling barrier film.

SECOND EMBODIMENT

In the second embodiment, an insulating film is formed using spin coating (coating film formation) using no plasma.

Figure 4:
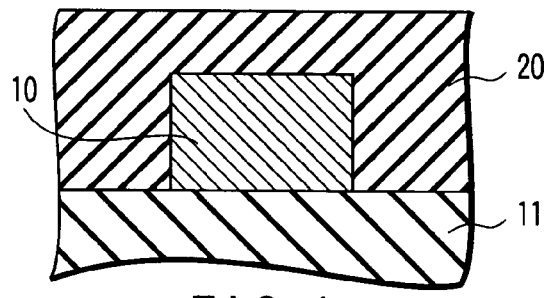
FIG. 4 is a sectional view showing a semiconductor device having an SOG film according to the second embodiment of the present invention.

FIG. 4 is a sectional view showing a semiconductor device according to the second embodiment of the present invention. As shown in FIG. 4, a metal wiring (e.g., Al-0.5 at % Cu) 10 is formed on an insulating film 11. An SOG film 20 is formed as an insulating film on the metal wiring 10 by spin coating. More specifically, a material such as polyarylether fluoride, BCB, Cytop, or MSQ is applied by spin coating, and sequentially baked at 80° C. for 1 min, at 200° C. for 1 min, and at 450° C. for 30 min.

According to the second embodiment, the SOG film 20 is formed without exposing the element to the $H_2$ plasma. Similar to the first embodiment, variations in threshold for operating a transistor can be suppressed.

The second embodiment uses spin coating to form an insulating film. Even a narrow space between wirings can be filled with the insulating film without generating any void.

Film formation by spin coating does not use any plasma, and no electrostatic damage is applied to a transistor.

THIRD EMBODIMENT

In the third embodiment, formation of an insulating film by sputtering in the $H_2$ plasma at 1% or less or by thermal CVD (Chemical Vapor Deposition) using no plasma will be explained.

Figure 5:
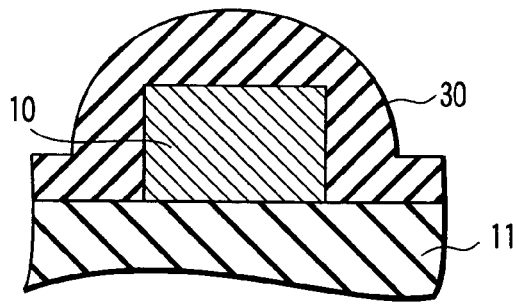
FIG. 5 is a sectional view showing a semiconductor device having a sputtered $SiO_2$ film according to the third embodiment of the present invention.

FIG. 5 is a sectional view showing a semiconductor device according to the third embodiment of the present invention. As shown in FIG. 5, a sputtered $SiO_2$ film 30 is formed as an insulating film on a metal wiring 10 by sputtering in the $H_2$ plasma at 1 at % or less.

Figure 6:
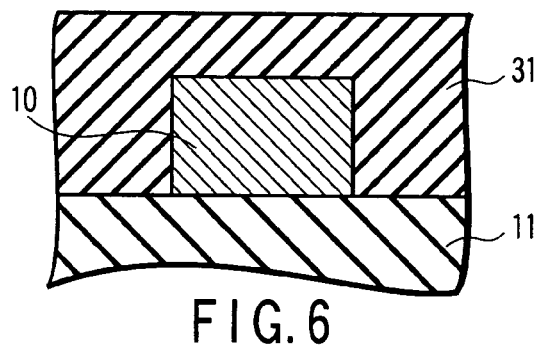
FIG. 6 is a sectional view showing a semiconductor device having a thermal CVD film according to the third embodiment of the present invention.

FIG. 6 is a sectional view showing another semiconductor device according to the third embodiment of the present invention. As shown in FIG. 6, a thermal CVD film 31 is formed as an insulating film on a metal wiring 10 by thermal CVD. The thermal CVD film 31 can be formed from TEOS (Tetra Ethyl Ortho Silicate) at 1,100 to 1,500 sccm, $O_3$ at 4,000 to 6,000 sccm, and $N_2$ at 8,000 to 12,000 sccm at a low temperature of 410° C.

As the thermal CVD film 31, e.g., an HCD-SiN film can also be formed. The HCD-SiN film can be formed even at a low temperature of 450° C. with the use of HCD (HexaChloroDisilane) because of low activation energy. The HCD-SiN film is formed by $NH_3$ reduction at 0.5 to 1 Torr and $HCD/NH_3=10$ sccm/1,000 sccm.

According to the third embodiment, the sputtered $SiO_2$ film 30 or thermal CVD film 31 is formed without exposing the element to the $H_2$ plasma. Similar to the first embodiment, variations in threshold for operating a transistor can be suppressed.

Film formation by sputtering can realize low-temperature film formation. An element can be formed without applying any thermal hysteresis damage to a transistor.

Film formation by thermal CVD does not use any plasma, and no electrostatic damage is applied to a transistor.

FOURTH EMBODIMENT

In the fourth embodiment, insulating films formed in the second and third embodiments are combined.

Figure 7:
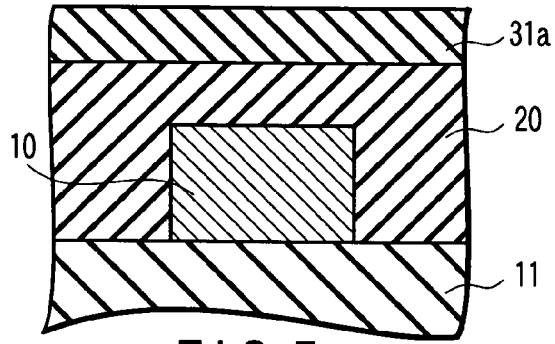
FIG. 7 is a sectional view showing a semiconductor device having an SOG film/HCD-SiN film according to the fourth embodiment of the present invention.

FIG. 7 is a sectional view showing a semiconductor device according to the fourth embodiment of the present invention. As shown in FIG. 7, an SOG film 20 is formed as a low dielectric constant film (film having a relative dielectric constant of, e.g., 4.0 or less) on a metal wiring 10 by spin coating. After that, an HCD-SiN film 31a is formed on the SOG film 20 by thermal CVD.

Figure 8:
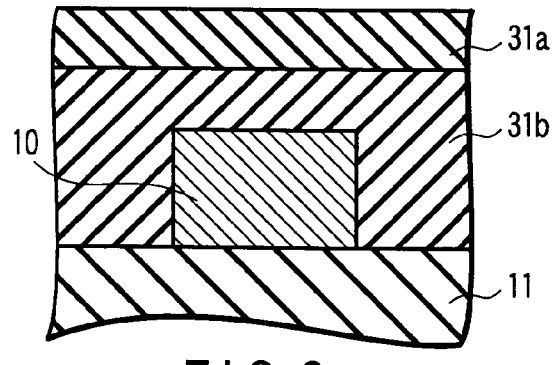
FIG. 8 is a sectional view showing a semiconductor device having a TEOS-$O_3$-CVD film/HCD-SiN film according to the fourth embodiment of the present invention.

FIG. 8 is a sectional view showing another semiconductor device according to the fourth embodiment of the present invention. As shown in FIG. 8, a TEOS-$O_3$-CVD film 31b is formed on a metal wiring 10 by thermal CVD at a low temperature of 410° C. An HCD-SiN film 31a is then formed on the TEOS-$O_3$-CVD film 31b by thermal CVD.

According to the fourth embodiment, the SOG film 20, HCD-SiN film 31a, and TEOS-$O_3$-CVD film 31b are stacked and formed without exposing the element to the $H_2$ plasma. Similar to the first embodiment, variations in threshold for operating a transistor can be suppressed.

In the fourth embodiment, a passivation film resistant to moisture can be formed by stacking an insulating film.

The use of a low dielectric constant SOG film can increase the element speed.

FIFTH EMBODIMENT

The fifth embodiment concerns a multilayered structure and method effective for a case wherein an insulating film is formed on a wiring and a contact to an upper wiring is formed without exposing an element to the $H_2$ plasma, like the above-described embodiments.

FIGS. 9 to 13 are sectional views, respectively, showing the steps in manufacturing a semiconductor device according to the fifth embodiment of the present invention.

As shown in FIG. 9, a metal wiring 10 is formed on an insulating film 11. A first insulating film 41 such as a TEOS film is formed on the metal wiring 10. A second insulating film 42 such as an SOG film or thermal CVD film (e.g., TEOS-$O_3$-CVD film) is formed on the first insulating film 41. An SOG film as the second insulating film 42 is formed by spin coating, or a TEOS-$O_3$-CVD film is formed by thermal CVD.

As shown in FIG. 10, the second insulating film 42 is planarized by CMP (Chemical Mechanical Polish) until part of the upper surface of the first insulating film 41 on the metal wiring 10 is exposed.

As shown in FIG. 11, a third insulating film 43 such as a TEOS film is formed on the first and second insulating films 41 and 42.

As shown in FIG. 12, the second and third insulating films 42 and 43 are removed, forming a contact hole 44.

As shown in FIG. 13, a metal film is formed in the contact hole 44, forming a contact 45 which is connected to the metal wiring 10 through the first and third insulating films 41 and 43. The contact 45 is in contact with the first and third insulating films 41 and 43, but does not contact the second insulating film 42.

According to the fifth embodiment, the first, second, and third insulating films 41, 42, and 43 are formed without exposing the element to the $H_2$ plasma. Similar to the first embodiment, variations in threshold for operating a transistor can be suppressed.

The SOG film or thermal CVD film (second insulating film) 42 is not directly formed on the metal wiring 10, but is formed after the first insulating film 41 is formed. The SOG film or thermal CVD film (second insulating film) 42 is not exposed in forming the contact hole 44. Thus, entrance of moisture into the SOG film or thermal CVD film (second insulating film) 42 can be prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising: forming a wiring layer;
    forming a first insulating film on the wiring layer under a condition that hydrogen in a plasma is not more than 1% in all gas components, the first insulating film not containing hydrogen;
    forming a second insulating film on the first insulating film under the condition that hydrogen in a plasma is not more than 1% in all gas components;
    planarizing the second insulating film until part of an upper surface of the first insulating film is exposed;
    forming a third insulating film on the part of the upper surface of the first insulating film and the second insulating film under the condition that hydrogen in a plasma is not more than 1% in all gas components; and
    forming a contact which is connected to the wiring layer through the first and third insulating films.

2. The method according to claim 1, further comprising forming a gate insulating film having a film thickness of not more than 80Å.

3. The method according to claim 1, wherein the first insulating film is formed by sputtering.

4. The method according to claim 1, wherein the first and second insulating films are formed by sputtering.

5. The method according to claim 3, wherein the first insulating film is formed at not more than 450° C.

6. The method according to claim 4, wherein the first and second insulating films are formed at not more than 450° C.

* * * * *